United States Patent
Pluszczyk (10) Patent No.: US 10,356,961 B2
(45) Date of Patent: Jul. 16, 2019

(54) ELECTRICAL UNIT FOR A MOTOR CONTROL CENTER WITH IMPROVED VENTILATION PROTECTION

(71) Applicant: Rockwell Automation Technologies, Inc., Mayfield Heights, OH (US)

(72) Inventor: Mariusz Pluszczyk, Tychy (PL)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/785,854

(22) Filed: Oct. 17, 2017

(65) Prior Publication Data
US 2019/0116695 A1    Apr. 18, 2019

(51) Int. Cl.
*H05K 5/02* (2006.01)
*H05K 7/20* (2006.01)

(52) U.S. Cl.
CPC ....... *H05K 7/20909* (2013.01); *H05K 5/0213* (2013.01); *H05K 5/0217* (2013.01); *H05K 7/20145* (2013.01); *H05K 7/20181* (2013.01)

(58) Field of Classification Search
CPC ....... G06F 1/181–182; H05K 7/20218–20381; H05K 7/20409–20418; H05K 7/20009–202; H05K 5/00–069; H05K 7/00–186; H05K 7/20909; H05K 7/20181; H05K 7/20145; H05K 5/0213; H05K 5/02217; H01L 23/367–3677; H01L 23/473; H01L 23/46–467
USPC ............ 361/679.01–679.45, 679.55–679.61, 361/676–678, 679.46–679.54, 688–727; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 4,447,858 A | * | 5/1984 | Farag | H02B 1/36 200/50.24 |
| 4,774,629 A | * | 9/1988 | Stanfield | H02B 1/36 361/627 |

(Continued)

OTHER PUBLICATIONS

Boltswitch, 3R Ventilation Grilles, Bulletin 147 Mar. 2016, Crystal Lake, Illinois—(1) page.

(Continued)

*Primary Examiner* — Anthony M Haughton
*Assistant Examiner* — Razmeen Gafur
(74) *Attorney, Agent, or Firm* — Boyle Fredrickson, S.C.

(57) ABSTRACT

Electrical units for a Motor Control Center (MCC) can be improved to provide ventilation for cooling elements of the unit while also providing better system protection by providing a combination of baffle assemblies and protective layers over openings providing the ventilation in doors of the units. The baffle assemblies can be configured to provide arc flash resistance for containing possible arc blasts within the units, and water intrusion resistance for protecting the units from possible water intrusion, while allowing substantial airflow. The protective layer, which could include a steel mesh and/or dust filter, can be configured to prevent solid objects above a certain size from passing through the opening allowing the airflow. As a result, airflow can be increased to cool elements of the unit while maintaining protections from arc flash, water intrusion and/or solid objects.

20 Claims, 6 Drawing Sheets

(56) References Cited

U.S. PATENT DOCUMENTS

| | | | | |
|---|---|---|---|---|
| 6,087,602 | A * | 7/2000 | Bernier | H01H 9/22 200/50.02 |
| 6,141,213 | A * | 10/2000 | Antonuccio | G06F 1/18 361/679.48 |
| 6,222,147 | B1 * | 4/2001 | Doughty | H01H 1/2058 218/149 |
| 6,365,826 | B1 * | 4/2002 | Stendardo | H01F 27/02 174/17 R |
| 6,556,404 | B2 * | 4/2003 | Figueroa | H05K 7/20909 361/103 |
| 6,977,354 | B1 * | 12/2005 | Shea | H01H 9/342 218/157 |
| 7,778,013 | B2 * | 8/2010 | Bruski | H05K 5/0213 361/605 |
| 7,843,689 | B2 * | 11/2010 | Moore | G06F 1/20 109/41 |
| 8,420,963 | B2 * | 4/2013 | Bhathija | H01H 9/286 200/50.12 |
| 9,635,774 | B2 * | 4/2017 | Abee | H05K 5/03 |
| 9,755,263 | B2 * | 9/2017 | Trevisan | H01M 8/249 |
| 2003/0085025 | A1 * | 5/2003 | Woods | H05K 7/206 165/104.33 |
| 2006/0021784 | A1 * | 2/2006 | Garmong | H05K 9/0001 174/100 |
| 2007/0026789 | A1 * | 2/2007 | Villela | E04D 13/174 454/250 |
| 2007/0097604 | A1 * | 5/2007 | Bruski | H02B 1/56 361/605 |
| 2008/0148642 | A1 * | 6/2008 | Mathieu | E05C 9/02 49/395 |
| 2010/0248609 | A1 * | 9/2010 | Tresh | H05K 7/20745 454/184 |
| 2012/0000169 | A1 * | 1/2012 | Ahn | B01D 46/10 55/383 |
| 2012/0031012 | A1 * | 2/2012 | Bonshor | A47J 17/02 52/27 |
| 2012/0298330 | A1 * | 11/2012 | Mysse, III | H05K 5/0213 165/96 |
| 2014/0126120 | A1 * | 5/2014 | Lehtola | H05K 7/1409 361/675 |
| 2014/0166623 | A1 | 6/2014 | Page, III | |
| 2016/0150658 | A1 * | 5/2016 | Tsukahara | G09F 7/18 361/679.01 |
| 2016/0349883 | A1 * | 12/2016 | Kiyoto | G06F 3/044 |
| 2017/0048999 | A1 * | 2/2017 | Abee | H05K 5/03 |
| 2017/0067663 | A1 * | 3/2017 | Barna | H05K 5/0213 |
| 2017/0120256 | A1 * | 5/2017 | Jeon | B03C 3/47 |
| 2017/0347473 | A1 * | 11/2017 | Freer | H05K 5/0213 |
| 2018/0057387 | A1 * | 3/2018 | Faulkinbury | C03B 5/2356 |
| 2018/0066429 | A1 * | 3/2018 | Yau | E06B 7/10 |
| 2018/0223592 | A1 * | 8/2018 | Malluck | E06B 5/20 |

OTHER PUBLICATIONS

Rockwell Automation, Centerline 2100 Motor Control Centers, Publication 2100-BR006C-EN-P—Apr. 2016, Milwaukee, Wisconsin—(16) pages.

Extended European Search Report dated Feb. 13, 2019 (7 pages).

* cited by examiner

FIG. 7 ic systems, and more particularly, to electrical units for electrical systems, such as Motor Control Centers (MCC's), in which improved ventilation protection is provided by arranging a baffle assembly in combination with a protective layer over an opening in configured to allow airflow to pass there through.

ELECTRICAL UNIT FOR A MOTOR CONTROL CENTER WITH IMPROVED VENTILATION PROTECTION

FIELD OF THE INVENTION

The present invention relates generally to electrical systems, and more particularly, to electrical units for electrical systems, such as Motor Control Centers (MCC's), in which improved ventilation protection is provided by arranging a baffle assembly in combination with a protective layer over an opening in configured to allow airflow to pass there through.

BACKGROUND OF THE INVENTION

Electrical systems with packaged electrical and electronic components are known and are in use. For example, Motor Control Centers (MCC's) are used for power and data distribution in large and industrial operations. In MCC's, a variety of components, such as switchgear, semiconductor power electronic circuits, programmable logic controllers, motor controllers, and so forth, are housed in large electrical enclosures that may be subdivided into sections or columns, which may be further subdivided into compartments. The MCC includes associated bus bars, interconnections and supporting structures for distribution of electrical power to the various compartments.

Typically, the MCC is connected to a main power line that may feed three-phase AC power to horizontal bus bars of the MCC. The horizontal bus bars, in turn, may feed the three-phase power to vertical bus bars disposed in each of the sections or columns of the MCC. The vertical bus bars, in turn, may feed the three-phase power to various electrical units (which typically include electrical components) that are installed in compartments of a section. The electrical units, in turn, may provide power terminals (conductors), such as copper bus bars, for feeding the three-phase power to a system environment, such as motors, as may be required for various applications.

It is often desirable to prevent such electrical units from reaching excessive temperatures as such temperatures for prolonged periods could result unpredictability and/or damage to the system. It is generally known to provide ventilation or airflow in electrical systems as a method for removing heat. Such ventilation can include an opening in the system for air to pass through to remove the heat. However, for MCC's, such openings may expose the system to possible damage from the environment, such as water intrusion, penetration of solid objects such as wires, and the like, and/or could expose the surrounding environment to the possibility of hazards such as arc flash or blast, a type of electrical discharge that could result from a low-impedance connection through air to ground or another voltage phase. Consequently, it is desirable to provide an improved system for ventilation protection which mitigates one or more of the foregoing disadvantages.

SUMMARY OF THE INVENTION

Electrical units for a Motor Control Center (MCC) can be improved to provide ventilation for cooling elements of the unit while also providing better system protection by providing a combination of baffle assemblies and protective layers over openings providing the ventilation in doors of the units. The baffle assemblies can be configured to provide arc flash resistance for containing possible arc blasts within the units, and water intrusion resistance for protecting the units from possible water intrusion, while allowing substantial airflow. The protective layer, which could include a steel mesh and/or dust filter, can be configured to prevent solid objects above a certain size from passing through the opening allowing the airflow. As a result, airflow can be increased to cool elements of the unit while maintaining protections from arc flash, water intrusion and/or solid objects.

An aspect of the invention can provide a system or method of ventilation assemblies on doors to provide an Ingress Protection (IP) rating of up to IP-54 (limited protection against dust ingress and protection against splash water from any direction), according to the International Electrotechnical Commission (IEC) standard EN60529, while allowing high performance achieved through good ventilation and airflow. The system can utilize a combination of arc resistance baffles, filters for dust protection and/or steel mesh spot welding assemblies. Arc resistance baffles, and brackets around the baffles, can provide drainage of water to prevent ingress of water inside the unit. A special arrangement of ribs of the arc resistance baffles, in combination with profiled brackets, can improve efficient drainage of water. Also, a filter for dust protection can prevent ingress of dust inside the unit which might affect operation of the unit. A steel mesh spot welding assembly, which could consist of two plates and a steel mesh having hole dimensions of 1 mm or less, can prevent ingress of solid objects, such as a 1 millimeter wire, inside the unit. The steel mesh spot welding assembly could be used when there is no dust filter installed for meeting a lesser IP rating, such as IP-43 (protection against solid objects over 1.0 mm, e.g. wires, and protection against sprays of water from any direction), while still allowing improved airflow. As a result, a good IP rating for a unit of an MCC can be maintained during operation with good ventilation to achieve high performance.

Specifically then, one aspect of the present invention can provide an electrical unit for a Motor Control Center (MCC), including: a door covering an assembly of components housed in an interior volume, the door including: an opening configured to allow an airflow to pass there through; a baffle assembly arranged in a support bracket mounted to the door, the baffle assembly covering the opening and including multiple baffles arranged in layers, the baffles being configured to be arc flash resistant for containing an arc blast within the interior volume, and water intrusion resistant for protecting the interior volume from water intrusion, while allowing the airflow to pass there through; and a protective layer covering the opening, the protective layer being configured to prevent solid objects having a size greater than a threshold from passing through the opening.

Another aspect of the present invention can provide an MCC including: a section forming a shell around a device mounting volume for supporting multiple electrical units, each electrical unit including: a door covering an assembly of components housed in an interior volume, the door including: an opening configured to allow an airflow to pass there through; a baffle assembly arranged in a support bracket mounted to the door, the baffle assembly covering the opening and including multiple baffles arranged in layers, the baffles being configured to be arc flash resistant for containing an arc blast within the interior volume, and water intrusion resistant for protecting the interior volume from water intrusion, while allowing the airflow to pass there through; and a protective layer covering the opening, the protective layer being configured to prevent solid objects having a size greater than a threshold from passing through the opening.

These and other objects, advantages and aspects of the invention will become apparent from the following description. The particular objects and advantages described herein can apply to only some embodiments falling within the claims and thus do not define the scope of the invention. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE OF THE INVENTION

Figure 1:
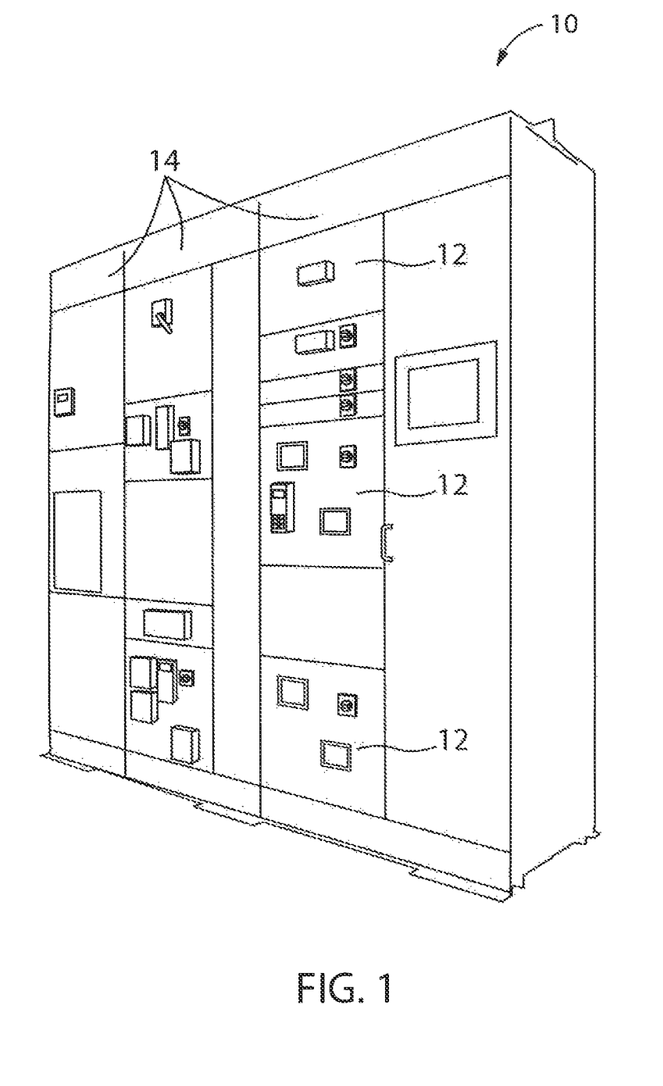
FIG. 1 is an isometric view of an exemplar electrical system which could be a Motor Control Center (MCC) in which electrical units of various types may be housed in accordance with an aspect of the invention.

Referring now to FIG. 1, an exemplar electrical system 10 is provided in which multiple electrical units 12 of various types may be housed. The electrical system 10 may be, for example, a Motor Control Center (MCC) or other industrial, commercial, marine, or other electrical system. In general, the electrical system 10 may provide one or more sections 14, each forming a shell around a device mounting volume for supporting the units 12. The shell may be made of any suitable material, such as heavy gage sheet metal, reinforced plastics, and so forth. The electrical system 10 may typically receive three-phase electrical power from an external power supply, such as a power supply grid, and/or data signals, via appropriate conduits (not shown), and distribute the received power and/or data signals to one or more of the sections 14 in various manners. The sections 14 may be electrically isolated from one another, or alternatively, may be electrically joined with other sections 14, such as via common horizontal power buses.

Figure 2:
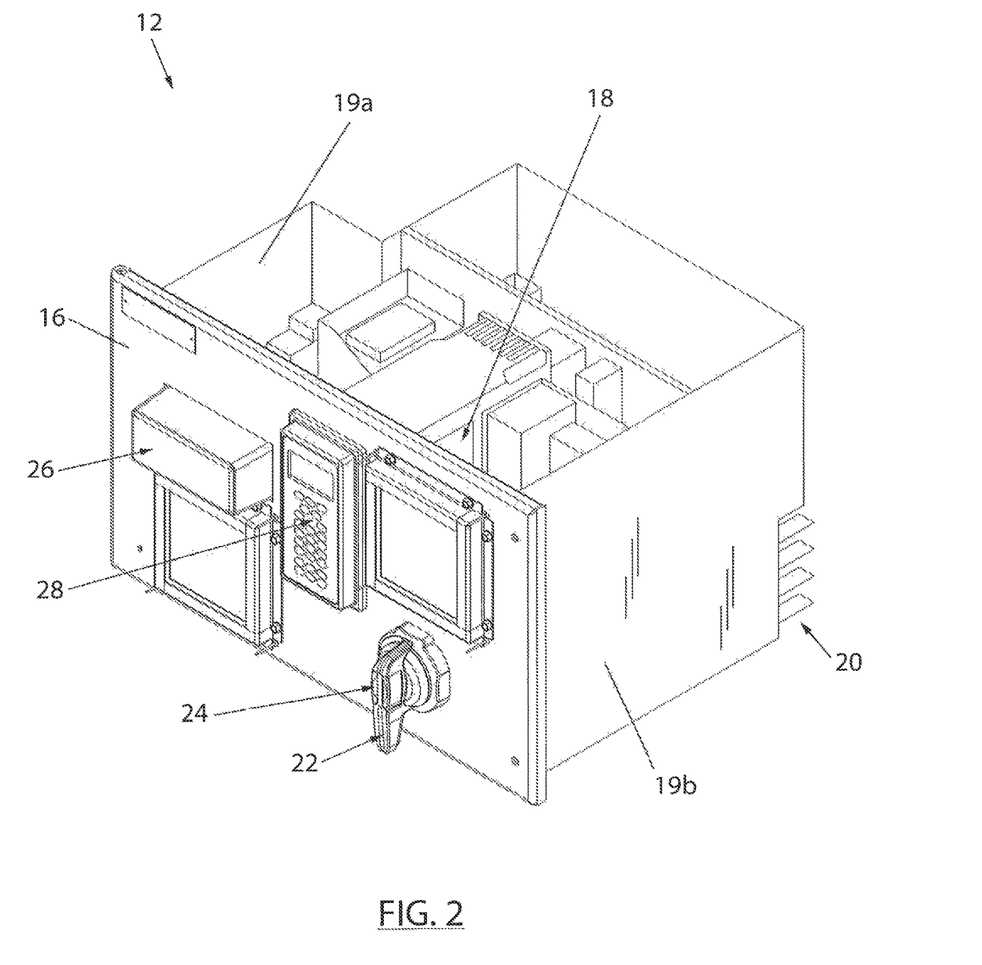
FIG. 2 is an isometric view of an exemplar electrical unit housed in the electrical system of FIG. 1.

It should be appreciated that the units 12 may be provided with varying configurations to achieve various purposes in the electrical system 10. With additional reference to FIG. 2, an isometric view of a unit 12 is illustrated by way of example. In general, each unit 12 can include a door 16 for covering an assembly of components 18 that are housed and supported within an interior volume of the unit. In one aspect, the door 16 can be in contact with opposing sidewalls 19a and 19b of the unit when closed, and can rotate about a hinge connection with respect to one of the opposing sidewalls 19a, 19b when opened. The units 12, in turn, can be mounted in sections 14 via known methods, such as screwed ("fixed feed" or "frame mounted") or snap-in ("withdrawable") engagement via load stabs 20 that are in communication with the interior volume, thereby providing mechanical and electrical connection to the electrical system 10. Exemplary components 18 of the units 12 may include relays, motor starters, and Programmable Logic Controllers (PLC's), among others. Doors 16 for the units 12 may also include, for example, a lever 22 (such as a rotary lever to turn ON and OFF a Circuit Breaker inside the unit and enabling opening of the door when the Circuit Breaker is OFF), a lock 24 for preventing the door from opening, one or more lights 26 for indicating a safe condition for opening the door, and/or a user interface 28 for monitoring and controlling aspects of the unit 12. A latch rail can be provided in each section 14 to interface with latches on the individual doors of the units 12.

Figure 3:
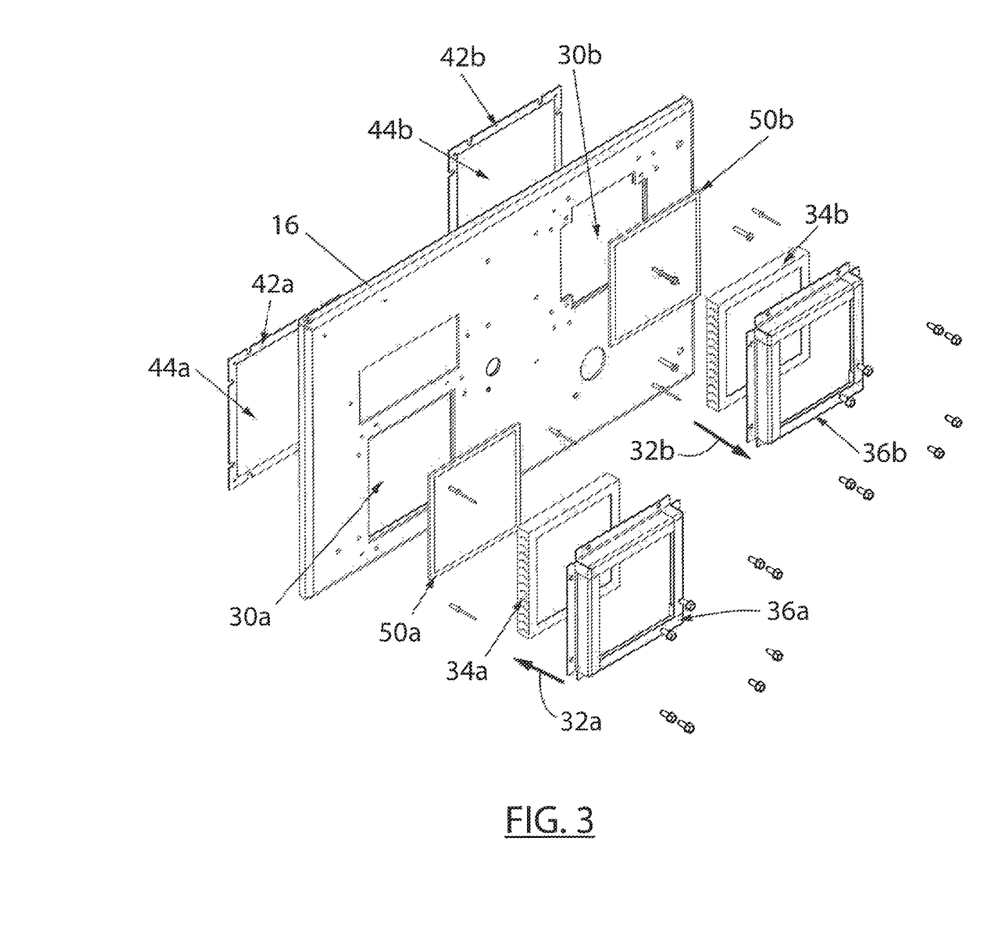
FIG. 3 is an exploded view of portions mounted to a door of the electrical unit of FIG. 2.

With additional reference to FIG. 3, an exploded front view from outside the unit 12 of portions which can be mounted to the door 16 for better protecting the system is provided in accordance with an aspect of the invention. The door 16 can include one or more openings 30 in the door that are configured to allow airflow to pass there through to provide ventilation for cooling the assembly of components 18. In one aspect, the door 16 can include first and second openings 30a and 30b, respectively. The first opening 30a can provide an ingress airflow 32a entering the unit 12, while the second opening 30b can provide an egress airflow 32b exiting the unit 12, with such airflows being directed by one or more fans. However, in other aspects, a single opening or more numerous openings could also be provided by the door 16.

A baffle assembly 34 can be arranged in a support bracket 36 mounted to the door 16. Preferably, the baffle assembly 34 and support bracket 36 can be mounted on a front (or outside) of the door 16. The support bracket 36 can include multiple apertures for receiving rivets, screws or other fasteners for mounting the baffle assembly 34 to the door 16. The baffle assembly 34 can be arranged to completely cover the opening 30. For example, as shown in FIG. 3, a first baffle assembly 34a can be arranged in a first support bracket 36a mounted to the door 16 to completely cover the first opening 30a, and a second baffle assembly 34b can be arranged in a second support bracket 36b mounted to the door 16 to completely cover the second opening 30b.

Figure 4:
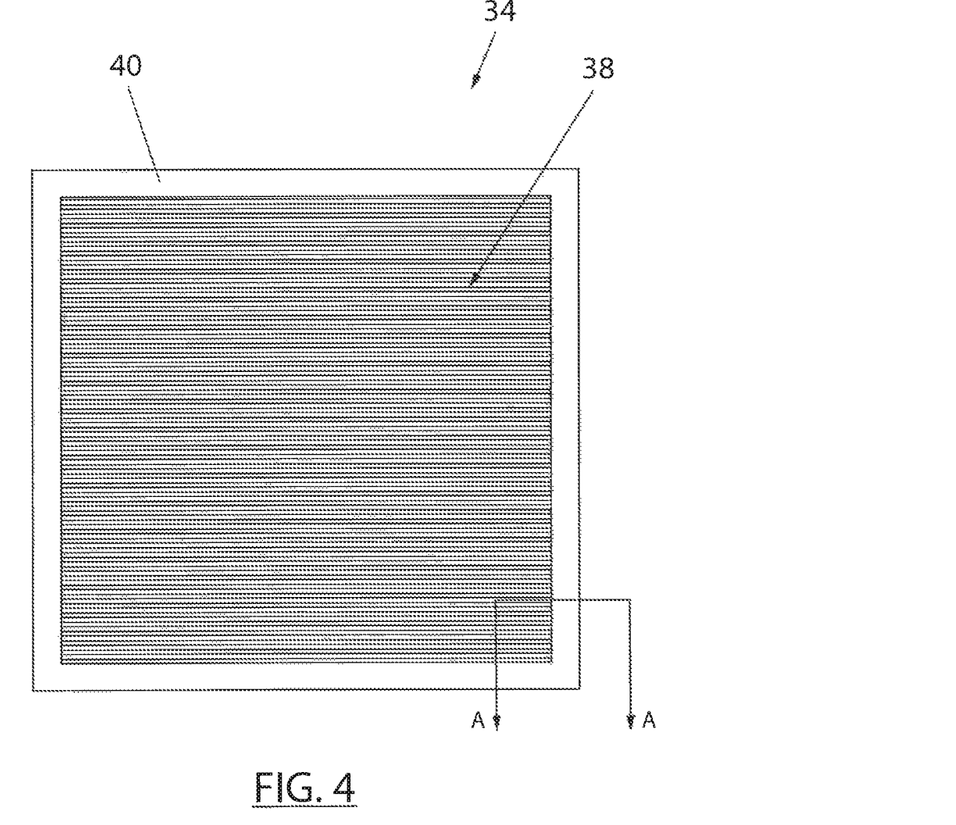
FIG. 4 is an exemplar baffle assembly mounted to the door of FIG. 2.
Figure 5:
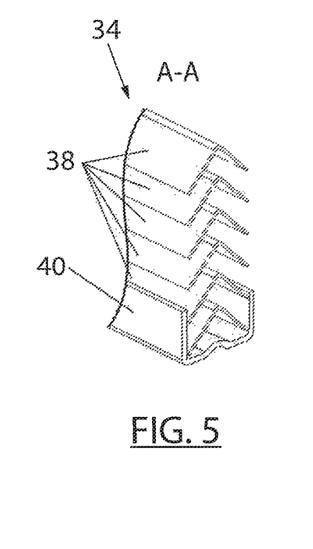
FIG. 5 is a detailed isometric view of a cross section of the baffle assembly of FIG. 4.

With additional reference to FIGS. 4 and 5, the baffle assembly 34 could comprise multiple individual baffles 38 that arranged in layers in a baffle frame 40. As may best be seen in the detailed view of FIG. 5, which is an isometric view taken along the cross section A-A of FIG. 4, the baffles 38 could be V-shaped louvers that are inverted and layered, one over another, in the baffle frame 40. The baffles 38 can be closely spaced and constructed from a conductive material such as steel so that they are configured to be arc flash resistant for containing possible arc blasts (a type of electrical discharge that could result from a low-impedance connection through air to ground or another voltage phase) from within the interior volume of the unit 12. The baffles 38 can also be closely spaced and arranged in the inverted fashion so that they are configured to be water intrusion resistant for protecting the interior volume of the unit 12 from water intrusion. Accordingly, the baffles 38 can be arc flash resistant and water intrusion resistant while allowing the airflow 32 to pass there through. One example of a suitable baffle assembly is a Type 3R Ventilation Grille as available from Boltswitch, Inc. of Crystal Lake, Ill.

Figure 6:
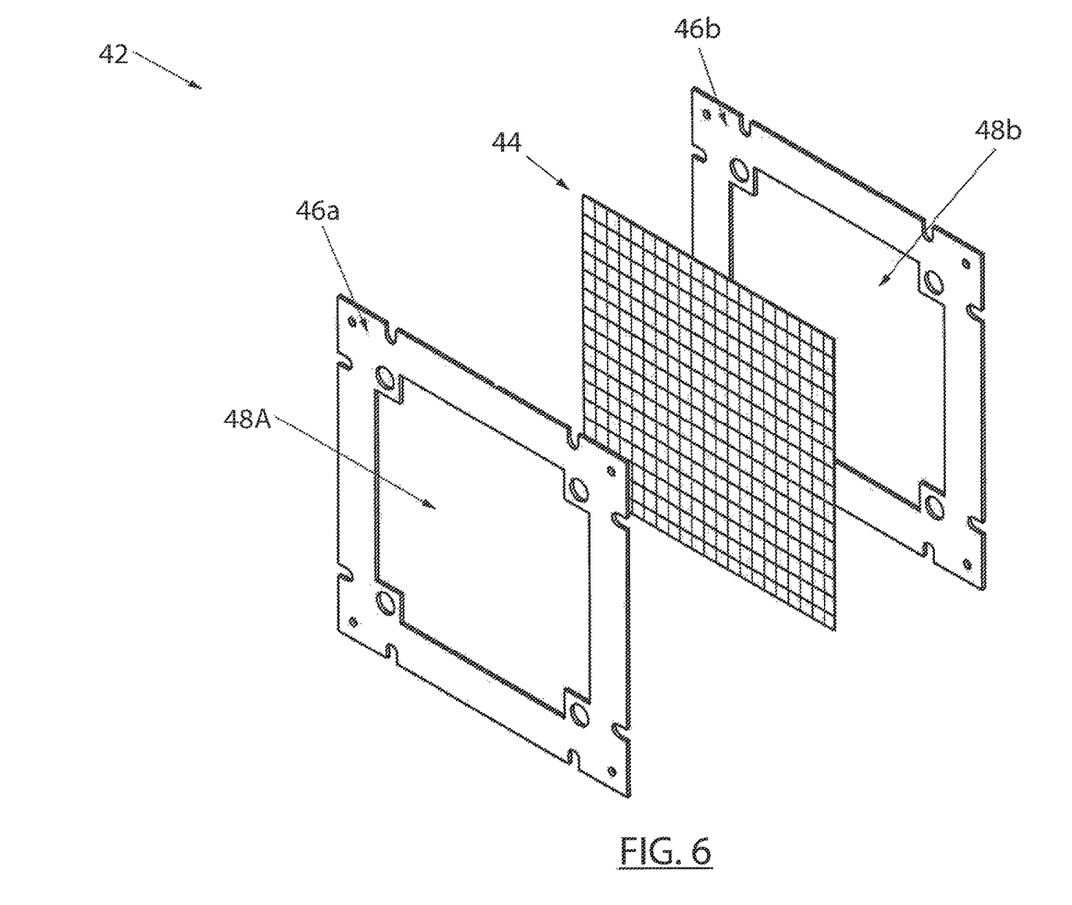
FIG. 6 is an exemplar protective layer comprising a steel mesh mounted to the door of FIG. 2.

In addition, one or more protective layers can be arranged to cover each opening 30. The protective layers can be being configured to prevent solid objects having a size greater than a threshold from passing through the opening 30. In one aspect, the protective layer can comprise a mesh assembly 42. For example, as shown in FIG. 3, a first mesh assembly 42a can be mounted to the door 16 to completely cover the first opening 30a, and a second mesh assembly 42b can be mounted to the door 16 to completely cover the second opening 30b. Preferably, the mesh assembly 42 can be mounted to the door 16 on a side opposite the baffle assembly 34, such as on a back (or inside) of the door 16. With additional reference to FIG. 6, the mesh assembly 42 can comprise a mesh 44 that is welded between first and second plates 46a and 46b having first and second plate openings 48a and 48b, respectively. The plates 46 can be metal and can include multiple apertures for receiving rivets, screws or other fasteners for mounting to the door 16. The mesh 44 can comprise a barrier made of connected strands of steel, metal, fiber or other flexible or ductile materials which can be arranged in a grid analogous to web or net. In one aspect, the mesh 44 of the mesh assembly 42 can be configured to have hole dimensions of 1 mm or less to prevent solid objects that are 1 millimeter or greater, such as wires, from passing through the opening. In addition, the mesh 44 can include a powder paint coating of about 0.1 millimeter thickness on the entire surface of the mesh. Accordingly, the powder paint can further reduce the hole dimensions by about 0.1 millimeter.

Figure 7:
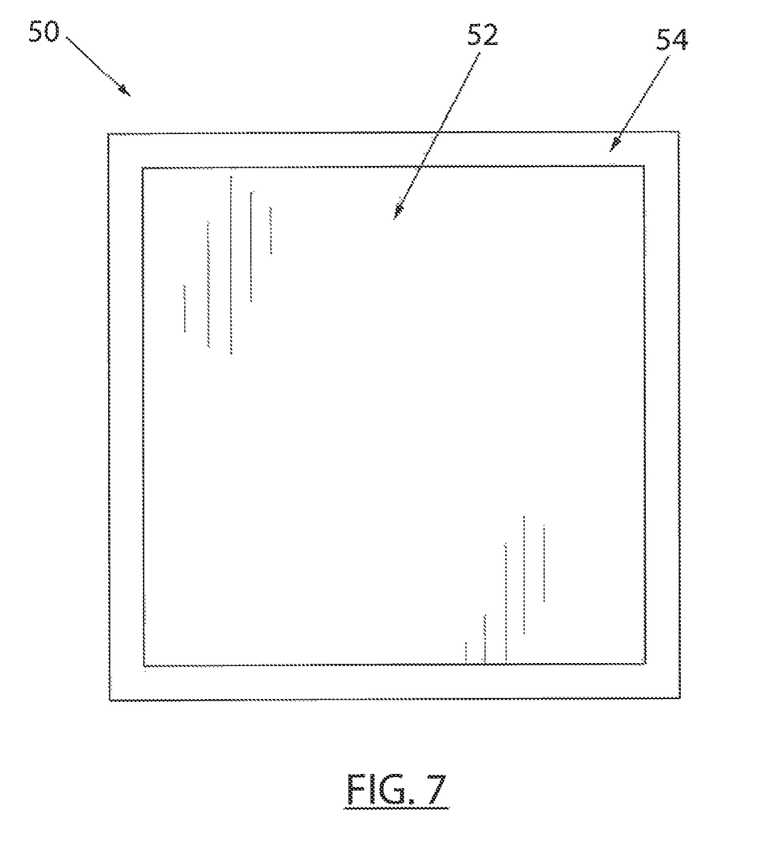
FIG. 7 is an exemplar protective layer comprising a dust filter mounted to the door of FIG. 2.

In another aspect, the protective layer can comprise a dust filter assembly 50 configured to prevent dust particles from passing through the opening 30. For example, as shown in FIG. 3, a first dust filter assembly 50a can be mounted to the door 16 to completely cover the first opening 30a, and a second dust filter assembly 50b can be mounted to the door 16 to completely cover the second opening 30b. Preferably, the dust filter assembly 50 can be arranged between the door 16 the baffle assembly 34. With additional reference to FIG. 7, the dust filter assembly 50 can comprise a dust filter 52 with gasket 54 around the perimeter of dust filter 52. The gasket 54 can further protect the interior volume of the unit 12 from intrusion by water and/or other contaminants.

The mesh assembly 42 and the dust filter assembly 50 can be used simultaneously or exclusively of one another. When the mesh assembly 42 is used without the dust filter assembly 50, it is believed that an IP rating up to IP-43 (protection against solid objects over 1.0 mm, e.g. wires, and protection against sprays of water from any direction) can be achieved. When the dust filter assembly 50 is used without the mesh assembly 42, it is believed that an IP rating up to IP-54 (limited protection against dust ingress and protection against splash water from any direction) can be achieved. Regardless, as a result of arranging the baffle assembly 34 in combination with a protective layer over the opening 30, airflow can be increased to cool elements of the unit 12 while maintaining protections from arc flash, water intrusion and/or solid objects.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom," "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as coming within the scope of the following claims. All of the publications described herein including patents and non-patent publications are hereby incorporated herein by reference in their entireties.

What is claimed is:

1. An electrical unit comprising:
   a door covering an assembly of components, the assembly of components being housed in an interior volume, the door comprising:
   an opening in the door configured to allow an airflow to pass there through;
   a baffle assembly arranged in a support bracket mounted to the door, the baffle assembly covering the opening and comprising a plurality of baffles arranged in layers, the baffles being configured to be arc flash resistant for containing an arc blast within the interior volume, and water intrusion resistant for protecting the interior volume from water intrusion, while allowing the airflow to pass there through; and
   a protective layer mounted to the door, the protective layer being in series with the baffle assembly, the protective layer being arranged to further cover the opening, the protective layer being configured to prevent solid objects having a size greater than a threshold from passing through the opening.

2. The electrical unit of claim 1, wherein the protective layer is a mesh assembly.

3. The electrical unit of claim 2, wherein the mesh assembly is configured to prevent solid objects greater than 1 millimeter from passing through the opening.

4. The electrical unit of claim 2, wherein the mesh assembly comprises a steel mesh welded between plates, and wherein the mesh assembly is mounted to the door on a side opposite the baffle assembly.

5. The electrical unit of claim 1, wherein the protective layer is a dust filter configured to prevent dust particles from passing through the opening.

6. The electrical unit of claim 1, wherein the opening, the baffle assembly and the protective layer are a first opening, a first baffle assembly and a first protective layer, respectively, and wherein the door further comprises a second opening, a second baffle assembly covering the second opening, and a second protective layer covering the second opening.

7. The electrical unit of claim 1, further comprising a plurality of load stabs in communication with the interior volume, the plurality of load stabs being configured to snap-in to an MCC for providing withdrawable engagement with the MCC.

8. The electrical unit of claim 1, wherein the baffles are V-shaped louvers.

9. The electrical unit of claim 1, further comprising a fan arranged across the opening to increase the airflow.

10. The electrical unit of claim 1, wherein the assembly of components comprises a relay, a motor starter or a Programmable Logic Controller (PLC).

11. A Motor Control Center (MCC) comprising:
a section forming a shell around a device mounting volume for supporting a plurality of electrical units, each electrical unit comprising:
a door covering an assembly of components, the assembly of components being housed in an interior volume, the door comprising:
an opening in the door configured to allow an airflow to pass there through;
a baffle assembly arranged in a support bracket mounted to the door, the baffle assembly covering the opening and comprising a plurality of baffles arranged in layers, the baffles being configured to be arc flash resistant for containing an arc blast within the interior volume, and water intrusion resistant for protecting the interior volume from water intrusion, while allowing the airflow to pass there through; and
a protective layer mounted to the door, the protective layer being in series with the baffle assembly, the protective layer being arranged to further cover the opening, the protective layer being configured to prevent solid objects having a size greater than a threshold from passing through the opening.

12. The MCC of claim 11, wherein the protective layer is a mesh assembly.

13. The MCC of claim 12, wherein the mesh assembly is configured to prevent solid objects greater than 1 millimeter from passing through the opening.

14. The MCC of claim 12, wherein the mesh assembly comprises a steel mesh welded between plates, and wherein the mesh assembly is mounted to the door on a side opposite the baffle assembly.

15. The MCC of claim 11, wherein the protective layer is a dust filter configured to prevent dust particles from passing through the opening.

16. The MCC of claim 11, wherein the opening, the baffle assembly and the protective layer are a first opening, a first baffle assembly and a first protective layer, respectively, and wherein the door further comprises a second opening, a second baffle assembly covering the second opening, and a second protective layer covering the second opening.

17. The MCC of claim 11, further comprising a plurality of load stabs in communication with the interior volume, the plurality of load stabs being configured to snap-in to the MCC for providing withdrawable engagement with the MCC.

18. The MCC of claim 11, wherein the baffles are V-shaped louvers.

19. The MCC of claim 11, further comprising a fan arranged across the opening to increase the airflow.

20. The MCC of claim 11, wherein the section is configured to distribute three-phase electrical power to each electrical unit.

* * * * *